(12) United States Patent
Chen et al.

(10) Patent No.: US 7,154,768 B2
(45) Date of Patent: Dec. 26, 2006

(54) NON-DESTRUCTIVE READOUT OF FERROELECTRIC MEMORIES

(75) Inventors: Zheng Chen, Colorado Springs, CO (US); Carlos A. Paz de Araujo, Colorado Springs, CO (US); Larry D. McMillan, Colorado Springs, CO (US)

(73) Assignees: Symetrix Corporation, Colorado Springs, CO (US); Matushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 11/030,277

(22) Filed: Jan. 6, 2005

(65) Prior Publication Data

US 2005/0180220 A1 Aug. 18, 2005

Related U.S. Application Data

(60) Provisional application No. 60/545,885, filed on Feb. 18, 2004.

(51) Int. Cl.
*G11C 11/22* (2006.01)
*G11C 7/00* (2006.01)

(52) U.S. Cl. ............ 365/145; 365/185.19; 365/189.09; 365/207

(58) Field of Classification Search ................ 365/145, 365/189.09, 185.19, 207
See application file for complete search history.

(56) References Cited

U.S. PATENT DOCUMENTS

| | | | |
|---|---|---|---|
| 2,876,436 A | 3/1959 | Anderson | |
| 4,873,664 A | 10/1989 | Eaton, Jr. | |
| 5,274,583 A * | 12/1993 | Rapp | ........................... 708/823 |
| 5,598,366 A | 1/1997 | Kraus et al. | |
| 6,912,167 B1 * | 6/2005 | Tam | ........................... 365/207 |
| 7,016,217 B1 * | 3/2006 | Sakai et al. | .................. 365/145 |

OTHER PUBLICATIONS

Hiroki Koike, et al.; "A 60-ns 1Mb Nonvolatile Ferroelectric Memory With A Nondrive Cell Plate Line Write/Read Scheme"; (copy of paper as submitted to the IEEE containing 15 pages); published in IEEE Journal of Solid State Circuits, vol. 31, No. 11, Nov. 1996.

\* cited by examiner

*Primary Examiner*—Son T. Dinh
(74) *Attorney, Agent, or Firm*—Patton Boggs LLP

(57) ABSTRACT

A device and method of reading a ferroelectric memory, including providing a ferroelectric memory including a ferroelectric memory cell, a charge integrator, and a bit line connecting the ferroelectric memory cell and the charge integrator. Pulses are applied to the ferroelectric memory cell, where each of the pulses are of a value lower than that which will destroy data stored in the memory cell. Output voltage values from the ferroelectric memory cell are accumulated by the charge integrator in response to each pulse. The output of the charge integrator may be read to determine whether the datum value stored in the memory cell is a logic high or low value. In one embodiment, the output of the charge integrator is read at a predetermined time after starting the pulses.

31 Claims, 4 Drawing Sheets

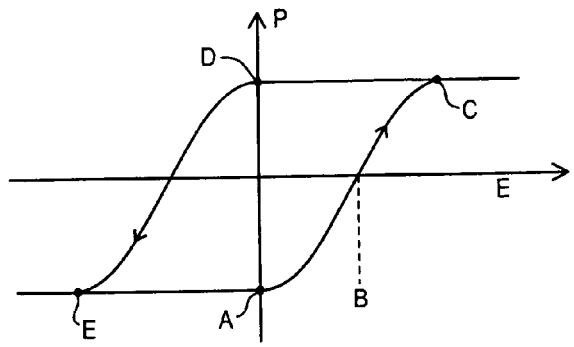
FIG. 1
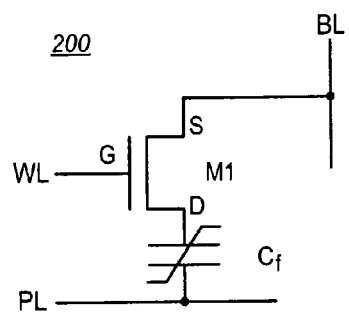
FIG. 2
PRIOR ART
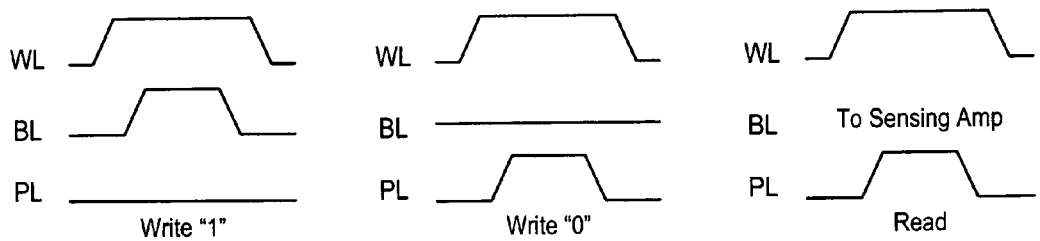
| FIG. 3A | FIG. 3B | FIG. 3C |
| PRIOR ART | PRIOR ART | PRIOR ART |

NON-DESTRUCTIVE READOUT OF FERROELECTRIC MEMORIES

CROSS-REFERENCES TO RELATED APPLICATIONS

This application claims priority from U.S. Provisional Patent Application Ser. No. 60/545,885 filed Feb. 18, 2004, the entire teachings of which are herein incorporated by reference.

BACKGROUND OF THE INVENTION

1. Field of the Invention

The principles of the present invention relate in general to ferroelectric memories, and in particular, but not by way of limitation, to a device and method for reading ferroelectric memory cells in a non-destructive readout manner.

2. Description of Related Art

It is well known that ferroelectric materials are capable of retaining polarization which can be used to store information in a non-volatile memory. For example, if a strong enough electric field or voltage is placed across a ferroelectric capacitor, when the voltage is removed, a polarization in the direction of the electric field remains. If the electric field is then placed across the same capacitor in the opposite direction, the ferroelectric material switches, and when the field is removed, a polarization in the opposite direction remains. Electronic circuits have been designed to associate the polarization in one direction with a logic "1" state, and polarization in the opposite direction with a logic "0" state. See, for example, the circuits described in the U.S. Pat. No. 2,876,436 issued Mar. 3, 1959 to J. R. Anderson.

As with other integrated circuit memories, these circuits include memory cells arranged in rows and columns, where each memory cell includes at least one switch and a capacitor having a pair of electrodes. The memory cells also include plate lines, sometimes referred to as drive lines, connected to one electrode of the capacitor in each cell, and bit lines connected to the other electrode of the capacitor through the switch. In the Anderson patent cited above, the switch is a diode. As known in the art, the switch can be a transistor having a gate, a source and a drain. The memory includes word lines connected to the control gate of the transistor. See, for example, U.S. Pat. No. 4,873,664 issued Oct. 10, 1989 to S. Sheffield Eaton, Jr. The transistor acts as a switch controlled by its gate to connect the capacitor to the bit line. Information is written into a memory cell by placing either a high or a low voltage on the bit line, turning the transistor ON to connect the bit line to the capacitor of the memory cell and placing a predetermined voltage between the high and low voltage on the drive line. The high voltage causes the memory cell to assume one polarization state, and the low voltage causes the memory cell to assume the opposite polarization state. The memory cell is read by creating a voltage difference between the bit line and drive line, and connecting the bit line to the capacitor via the transistor. If the ferroelectric state changes due to the applied voltage, the bit line will assume a first voltage, and if the ferroelectric state does not switch, then the bit line will assume a second voltage. The bit line voltage is compared to a reference voltage that is about half-way between the first and second voltages; if the bit line voltage is below the reference voltage, a sense amp drives an output low, and if the bit line voltage is above the reference voltage, a sense amp drives an output high. In this way, the state of the ferroelectric capacitor prior to reading determines the output state when the cell is read.

In the above-described memory and other similar conventional ferroelectric memories, the drive line is pulsed with a high logic voltage level. The drive line, being relatively long and connected to the electrodes of many capacitors, has a high capacitance. Thus, it takes a relatively long time for the voltage to rise to its full value, thereby resulting in a long reading and writing time to the memory. To speed up the read and write processes, ferroelectric memories in which the drive line is not pulsed have been developed. See Hiroki Koike et al., "A 60-ns 1 Mb Non-volatile Ferroelectric Memory With A Nondrive Cell Plate Line Write/Read Scheme" IEEE Journal of Solid State Circuits, Vol. 31, No. 11, November 1996. Another solution has been to make the drive line parallel to the bit line, so that only one ferroelectric memory cell of a matrix of memory cells at a time is pulsed. See the embodiment of FIG. 6 in the Eaton, Jr. patent mentioned above. Segmented drive lines have also been proposed to speed up the drive line cycle and reduce power. See U.S. Pat. No. 5,598,366. However, all these memories have not been successful due to significant disturb problems. "Disturb" is a problematic feature of most prior art ferroelectric memories in which "disturb" voltages, usually small in amplitude, are unavoidably applied to non-accessed memory cells, which voltages can change the memory state and thus lead to erroneous readings. For example, in the Koike et al. reference, it is explained that leakage from the bit line and drive line to the nodes of a capacitor that is not accessed can destroy the data. This problem is overcome with a compensation scheme which adds complexity to the memory and slows it down. Thus, the disturb problem has either resulted in memories that have been made more complex and slower to overcome the disturb, as in the Koike et al. reference, or simply have resulted in the design being too unreliable to be successful, such as the Eaton, Jr. patent.

Various ferroelectric materials are known, such as Phase III potassium nitrate, bismuth titanate and the PZT family of lead zirconate and titanate compounds, for example. One characteristic of such materials is a hysteresis curve or loop of the sort illustrated in FIG. 1, where the abscissa represents the field voltage applied to the material and the ordinate represents the polarization of the material. Because of the hysteresis curve, if a capacitor is formed using a ferroelectric material between its plates, the flow of current through the capacitor will depend on the prior history of the voltages applied to the device. Briefly, if a ferroelectric capacitor is in an initial state and zero volts is applied, it may have a polarization indicated at point A in FIG. 1. A physical characteristic of the device will be its so called "coercive voltage" represented by a dashed line B. If a positive voltage greater than the coercive voltage B is applied across the capacitor, then the capacitor will conduct current and move to a new polarization represented by point C. When the voltage is brought to zero, rather than returning to the polarization represented at A, the ferroelectric capacitor instead will maintain essentially the same polarization, as indicated at point D. A further positive voltage will cause relatively little change in the polarization, moving it toward or beyond point C. However, a substantial enough negative voltage will cause the polarization to vary as represented by point E. Thereafter, when such negative voltage is removed from the capacitor, the polarization of the device remains essentially the same and moves to point A. Thus, points A and D represent two states occurring at zero volts applied across the capacitor, but depend on the history of voltage applied to the device.

Consequently, a ferroelectric capacitor is usable as part of a memory cell. Point A can represent a logic "0," and point D can represent a logic "1." To determine the state of a ferroelectric capacitor, a voltage pulse may be applied and the current which follows be sensed to thereby determine the state. To write into a ferroelectric capacitor cell, a positive or negative voltage is applied to the plates of the capacitor, which causes the ferroelectric material to move along its hysteresis curve as shown in FIG. 1, forcing it into a stable state corresponding to the data, a logic "1" or "0." To read from a ferroelectric memory cell, if a positive pulse having a logic high voltage level is applied and relatively little current is drawn or charge moved by the capacitor, then this indicates that the capacitor is in state D. If substantial charge moves, this indicates that the capacitor is in state A.

It will be appreciated that if a read operation occurs and a significant amount of charge moves to cause the capacitor to move from one stable state to the other along with the hysteresis curve, then the data within the cell is flipped, as the cell moves to the opposite stable state that represents the opposite binary digit. This reading operation causes destruction of the content of the ferroelectric memory cell and is appropriately called destructive readout. Restoration of the data is usually utilized when reading a memory cell using a ferroelectric capacitor as the memory element. However, restoration consumes time and power.

FIG. 2 is a schematic of a conventional ferroelectric memory cell 200 having a 1T1C configuration, as provided by U.S. Pat. No. 4,873,664 by Ramtron Corp. The memory cell includes a ferroelectric capacitor $C_f$ and MOSFET transistor M1. A bit line BL is coupled to a source terminal S of the transistor M1 and one plate of the capacitor $C_f$ is coupled to a drain terminal D of the transistor M1. A word line is coupled to a gate terminal G of the transistor M1 for controlling operation thereof. A plate line PL is coupled to a second plate of the capacitor $C_f$.

FIGS. 3A and 3B are timing diagrams showing timing signals for writing to the conventional ferroelectric memory cell 200 of FIG. 2. FIG. 3A provides timing signals to write a logic "1" to the memory cell 200 by turning the bit line BL high while the word line WL is high to turn on the MOSFET M1 and the plate line PL remains low. To change the polarity of the ferroelectric capacitor $C_f$, FIG. 3B shows that the plate line PL is turned high while the word line WL is high and the bit line BL remains low.

FIG. 3C is a timing diagram showing timing signals for reading data stored in memory cell 200. The data is read out by turning the word line WL high to turn the MOSFET transistor ON and applying a voltage on the plate line PL. Depending on the value of the data stored in the capacitor $C_f$, a voltage level applied to the bit line BL increases or decreases. Typically, the voltage level applied to the plate line PL is high (e.g., 3V) to guarantee that enough voltage difference is applied to the bit line BL to differentiate between a logic "0" and "1" stored in the capacitor $C_f$. As understood in the art, when a voltage level above the coercive voltage (e.g., 1.0V) is applied to a ferroelectric capacitor $C_f$, data being stored in the capacitor $C_f$ is destroyed. This read operation is called destructive readout (DRO).

What is needed is a circuit and process for reading the data stored in a ferroelectric memory cell that utilizes a non-destructive readout (NDRO) technique.

SUMMARY OF THE INVENTION

To overcome the problems of conventional destructive and non-destructive readout techniques to read data from ferroelectric memory cells, the principles of the present invention provide for non-destructive readout utilizing a conventional ferroelectric memory cell and sense amplifier and further includes an integrator circuit electrically coupled therebetween along a bit line. In non-destructively reading out data from the ferroelectric memory cell, low voltage pulses (e.g., below one-half the coercive voltage of the memory cell) may be input to the ferroelectric memory cell via a plate line. The integrator may accumulate the output voltage values of the memory cell over a duration of time. Based on an accumulated voltage value by the integrator, a determination may be made utilizing the sense amplifier as to whether a logic "1" or "0" is being stored in the memory cell.

In one embodiment, the principles of the present invention include a device and method of reading a ferroelectric memory. The method includes providing a ferroelectric memory including a ferroelectric memory cell, a charge integrator, and a bit line connecting the ferroelectric memory cell and the charge integrator. Pulses are applied to the ferroelectric memory cell, where each of the pulses are of a value lower than that which will destroy data stored in the memory cell. Output voltage values from the ferroelectric memory cell are accumulated by the charge integrator in response to each pulse. The output of the charge integrator may be read to determine whether the datum value stored in the memory cell is a logic high or low value. In one embodiment, the output of the charge integrator is read at a predetermined time after starting the pulses.

In another embodiment, a ferroelectric memory includes a ferroelectric memory cell, a charge integrator to accumulate two or more signals received from the ferroelectric memory cell, and a bit line connecting the memory cell and charge integrator. The charge integrator may include an operational amplifier.

Another embodiment includes a method for reading a ferroelectric memory, including selecting a ferroelectric memory cell from which to read a datum value stored therein. Pulses may be input to the ferroelectric memory cell, where each pulse has a signal level below a coercive signal level to preserve the datum value stored therein. Signal levels output by the ferroelectric memory cell may be accumulated in response to the inputting of the pulses to the ferroelectric memory cell.

Still yet, another aspect includes (i) a system that comprises a ferroelectric memory including ferroelectric memory cells configured in a matrix of rows via word lines and columns via bit lines, (ii) a charge integrator connected to each bit line to accumulate signal levels received from a ferroelectric memory cell along a corresponding bit line, and (iii) a read circuit selectably connected to one ferroelectric memory cell of a column to input pulses having a signal level below that input which destroys a stored datum value to the selected ferroelectric memory cell, the pulses causing the charge integrator to accumulate a total signal level output from the ferroelectric memory cell.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 1 is a graph showing an hysteresis curve as understood in the art;

FIG. 2 is a schematic of a conventional ferroelectric memory cell;

FIGS. 3A through 3C are timing diagrams showing timing signals for writing to the conventional ferroelectric memory cell of FIG. 2;

DETAILED DESCRIPTION OF THE DRAWINGS

Figure 4A:
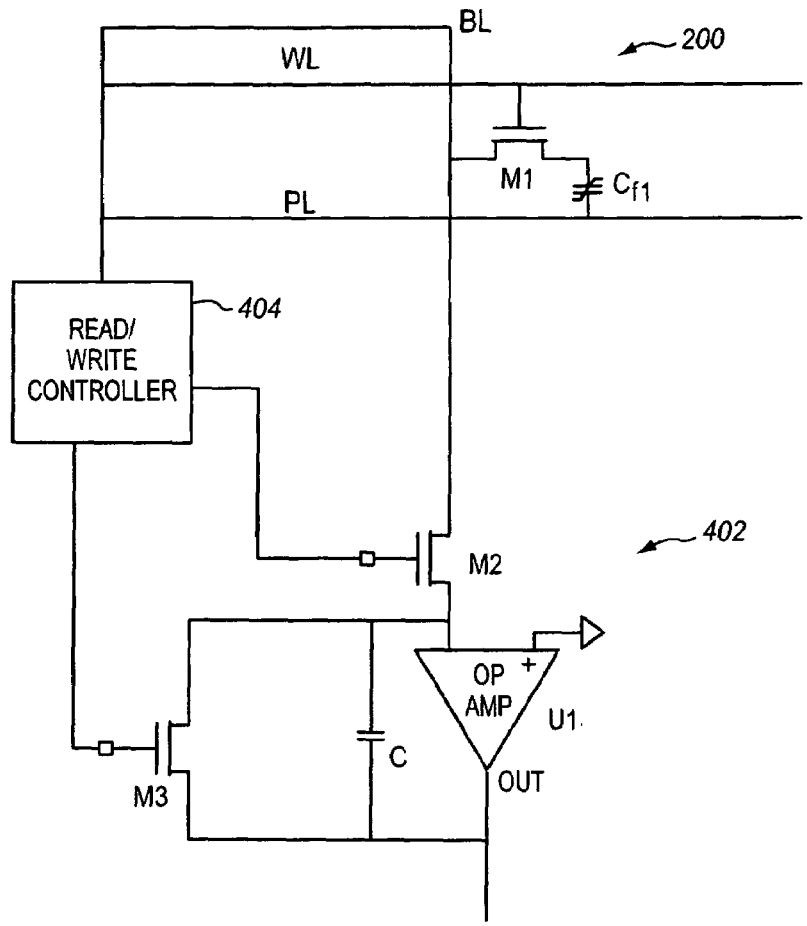
FIG. 4A is a schematic illustrating an exemplary circuit according to the principles of the present invention including a conventional ferroelectric memory cell and charge integrator.

FIG. 4A is a schematic illustrating an exemplary circuit including a conventional ferroelectric memory cell 200 (FIG. 2) and charge integrator 402. The charge integrator 200 is composed of an operational amplifier U1 having two input terminals, one negative (−) and one positive (+), and an output terminal OUT. In being configured as a charge integrator, the positive input terminal (+) may be grounded and a capacitor C may be connected between the negative input terminal (−) and the output terminal OUT. In one embodiment, a reset switch M3 may be connected between the negative input terminal (−) and output terminal OUT, in parallel with the capacitor C, to reset the capacitor C before or after read operations. It should be understood that the charge integrator 402 may be configured to have positive rather than negative accumulation, as understood in the art. It should be further understood that the charge integrator may be configured using electronic components that do not include an op amp, but are capable of summing signal values or levels (i.e., voltage or current levels).

A switch M2 is connected along the bit line BL between the ferroelectric memory cell 200 and charge integrator 402. The switch M2 may be a MOSFET switch or other switching element, including diodes. A sense amplifier (not shown), as understood in the art, may be connected to the output terminal OUT of the charge integrator 402 for sensing an accumulated voltage level therefrom. Although the ferroelectric memory cell 200 is shown in a 1T1C configuration, 2T2C, 3T3C, or other configurations may similarly be utilized in accordance with the principles of the present invention.

Write operations to the ferroelectric memory cell 200 may be substantially the same as conventional write operations as provided in FIGS. 3A–3C. During the write operations, switch M2 is disabled, thereby electrically isolating the charge integrator 402 from the ferroelectric memory cell 200. In one embodiment, a read/write controller 404, which may be an integrated circuit and/or processor, and that is either locally or remotely located from the ferroelectric memory cell 200 may be utilized to control operation of the switch M2 during write and read operations.

Figure 4B:
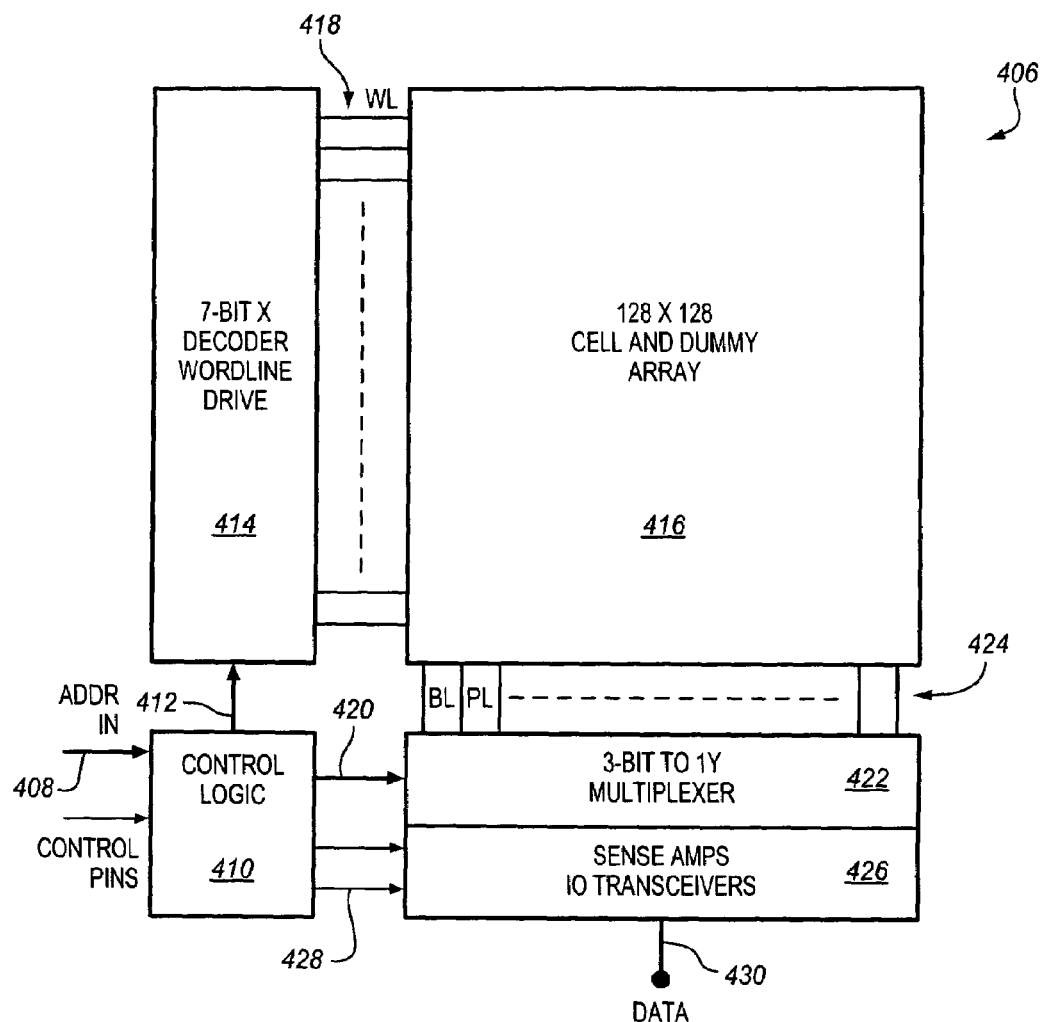
FIG. 4B is a block diagram illustrating an exemplary integrated circuit memory in which the ferroelectric memory cell of FIG. 2 and charge integrator of FIG. 4A may be utilized.

FIG. 4B is a block diagram illustrating an exemplary integrated circuit memory 406 in which memory cell 200 of FIGS. 2 and 4A is a part, and in which the charge integrator 402, may be utilized. For simplicity, the embodiment shown is for a 16K×1 FeRAM; however, a wide variety of sizes and types of memories, including, but not limited to, those in which the addresses are not multiplexed, such as flash or SRAM type memories. In the 16K embodiment shown, there are seven address input lines 408 which connect through control logic section 410 and lines 412 to the X decode section 414. In one embodiment, the control logic 410 includes the read/write controller 404 of FIG. 4A. X decoder 414 is connected to a 128×128 memory cell array 416 via 128 lines 418, which comprise the word lines WL. Three other address lines 408 are decoded via control logic 410 to generate 8 Y select lines 420 to drive Y multiplexer 422, which drives the bit lines BL and plate lines PL 424. It should be understood that the Y decoder 422 may drive the plate lines PL rather than the X decoder 414. Control logic signal generator 410 is connected to the sense amplifier and IO transceivers circuit 426 via lines 428. These lines provide a sense signal for sensing the bit lines BL, as understood in the art, as well as other signals. The number of lines 418, 424, 428 and 420 depends on the size of the array 416. Data bus 430 is a bi-directional sixteen bit bus connected to the sense amplifier and IO transceivers 426 and providing a sixteen bit data input into the memory. The embodiment of the memory cell array 416 shown contains 128×128=16,384 memory cells, which is conventionally designated as 16K. These cells are ferroelectric switching capacitor-based cells, such as 200.

Figure 6:
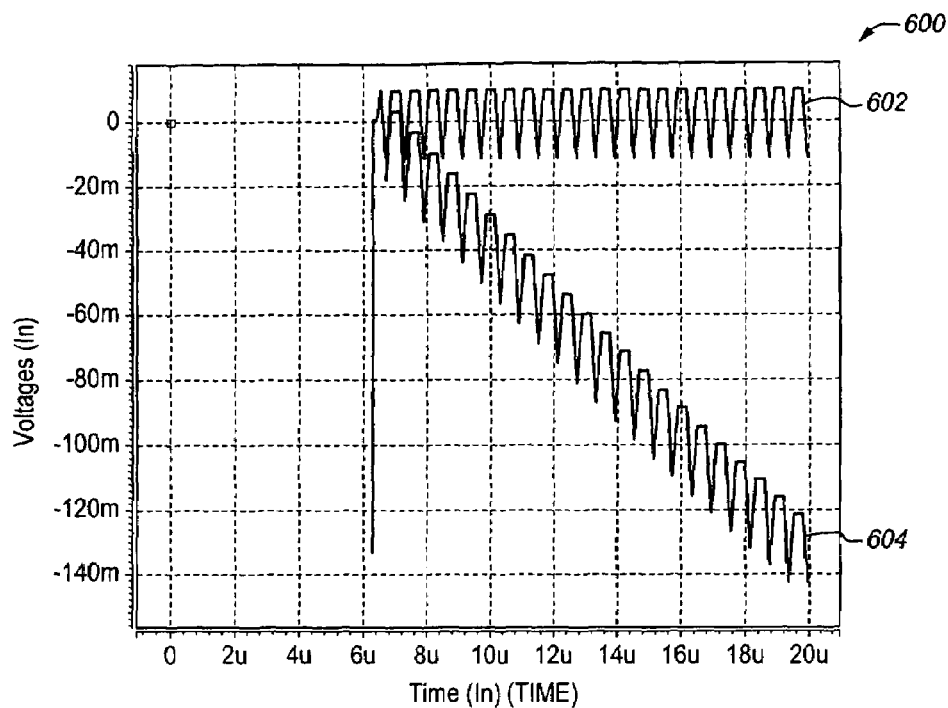
FIG. 6 is a graph of exemplary simulation results showing an accumulated signal level from the charge integrator during a read operation.

The operation of the memory in FIG. 6 is as follows. The address input lines 408 may carry address signals that are latched, buffered, and decoded by control logic 410 and passed to X decoder 414 and two-way Y multiplexer 422, respectively. X decoder 414 decodes the address signals and places the word line signals on one of the word lines 418; generally a signal is placed on the word line of the cell that is addressed. As mentioned above, the sense amplifiers and IO transceivers circuit 426 includes sense amplifiers, which are located along bit lines 424 to sense and amplify the signals on the selected lines, and the IO transceiver in circuit 426 drives and receives data from data bus 430.

The various components of memory 406 in FIG. 4B are shown only as an exemplary embodiment to illustrate how the invention is used. However, there are literally hundreds of memory designs in which the invention may be used, and different designs place the various components in different locations, may not use some of the components, or may use other components. For example, in different memory designs, the charge integrators are placed at the midpoint of lines 424, at the same end as the line drivers, or some other place in the circuit. In some memories, signal generator 410 and X decoder 414 and word line driver circuit may be combined into a single signal generation unit. The circuitry of the various components of memory 406, except as discussed elsewhere herein, is known in the art of integrated circuit memory design, and will not be further discussed herein. Other logic required or useful to carry out the functions outlined above, as well as other known memory functions, is also included in memory 406, but is not shown or discussed, as it is not directly applicable to the invention.

Figure 5:
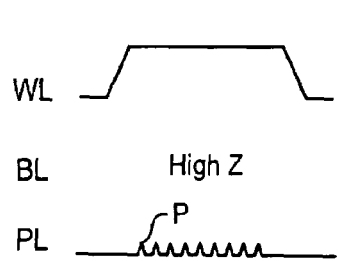
FIG. 5 is a timing diagram showing exemplary signals for reading from the ferroelectric memory cell in a non-destructive readout manner.

FIG. 5 is a timing diagram showing exemplary signals for reading from the ferroelectric memory cell 200 (FIG. 4) in a non-destructive readout manner. During the reading of the ferroelectric memory cell, the switch M2 is turned ON so that the charge integrator 402 is electrically connected to the ferroelectric memory cell 200.

As shown, a write operation is performed by transitioning word line WL that controls the switch M1 (FIG. 4) to access the ferroelectric capacitor $C_f$. The bit line BL is set to a high impedance (high Z) during the read operation as no voltage source is connected thereto. Rather than applying a conventional high voltage signal to the ferroelectric memory cell 200, which would destroy a datum value stored therein due to being above the coercive voltage, multiple pulses P having a voltage level below that which destroys the datum value in the ferroelectric memory cell 200 may be input thereto via the plate line PL. In one embodiment, the voltage level of the pulses P may be less than half the coercive voltage, thereby ensuring that the datum value stored in the ferroelectric memory cell 200 is not destroyed. For example, the voltage level of the pulses P may range from 0.1V to 0.5V.

FIG. 6 is a graph 600 of exemplary simulation results showing an accumulated signal level from the charge integrator 402 during a read operation. The graph 600 shows the accumulated signals as voltage (mV) versus time (μsec). A first accumulated output signal 602 is shown to oscillate about 0V as the pulses that are input to the ferroelectric memory cell 200 (FIG. 4) cause an output from the ferroelectric memory cell 200 to oscillate about 0V when a datum value stored in the ferroelectric memory cell is a logic "0". When a datum value stored in the ferroelectric memory cell 200 is a logic "1," the pulses input to the ferroelectric memory cell 200 cause the charge integrator 200 to decrease in value due to the bit line BL being input to the negative input terminal (−) of the op amp U1.

The resulting accumulation of output voltages from the ferroelectric memory cell 200 becomes clearly differentiable depending on whether the datum value stored in the ferroelectric memory cell 200 is a logic "1" or "0" (i.e., logic high or low) over a short duration of time. For example, at 60 μsec, there is an approximately 100 mV difference between the two accumulated signals. At a predetermined amount of time, the accumulated voltage level may be sensed and/or a determination made as to whether the stored datum value is a logic "1" or "0." The predetermined amount of time may be determined by the number of pulses, such as five or more pulses. It should be understood that the pulses input to the ferroelectric memory elements 200 may be current pulses rather than voltage pulses.

Figure 7:
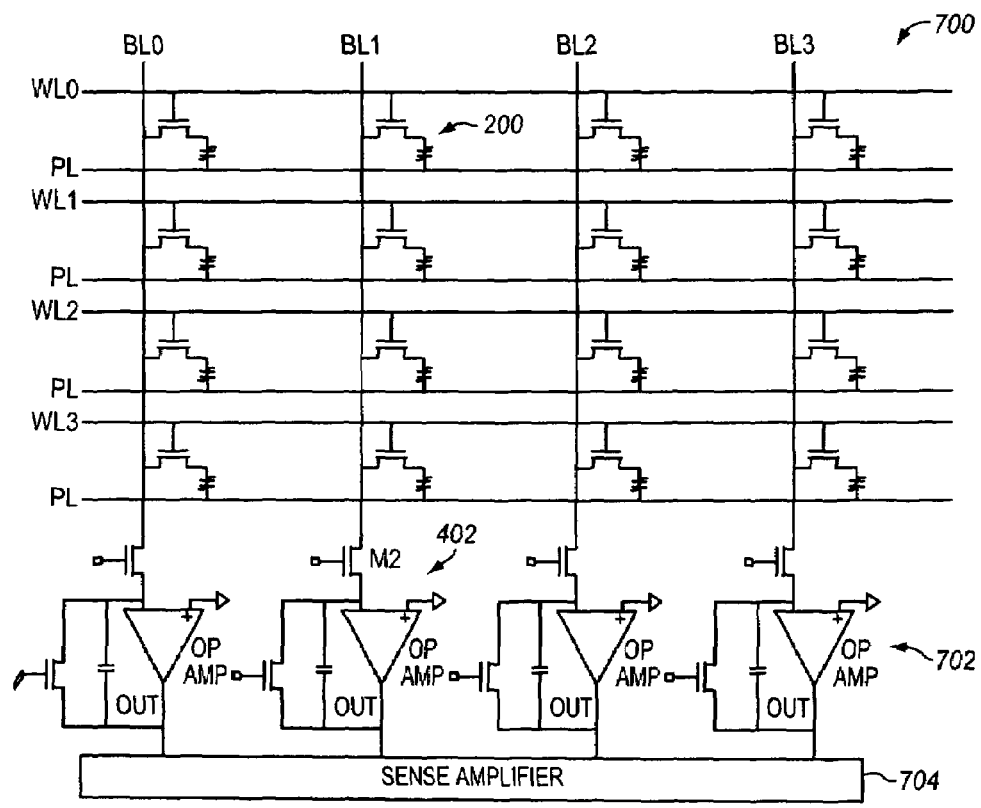
FIG. 7 is a schematic of an exemplary matrix of ferroelectric memory cells and an array of charge integrators.

FIG. 7 is a schematic of an exemplary matrix 700 of ferroelectric memory cells 200 and an array 702 of charge integrators 402. A sense amplifier 704 having individual sense amplifier circuits (not shown) respectively connected to the output terminal OUT of each charge integrator may be included. It should be understood that the rows and columns may be reversed such that the charge amplifiers 402 and sense amplifier 704 are configured along rows rather than columns.

Figure 8:
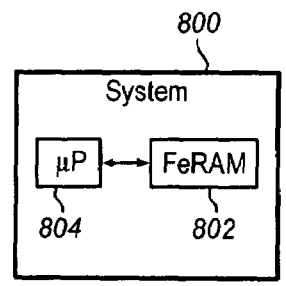
FIG. 8 is an illustration of an exemplary system that includes a ferroelectric memory that provides for non-destructive readout according to the principles of the present invention.

FIG. 8 is an illustration of an exemplary system 800 that includes a ferroelectric memory 802 that provides for non-destructive readout according to the principles of the present invention. The system 800 may include a microprocessor (μP) to store and read data therefrom. The system may be virtually any system or device that is capable of utilizing ferroelectric memory. Examples of such systems include computing devices (e.g., calculator, hand-held computers), communication devices (e.g., mobile phones, personal digital assistants), and storage devices (e.g., digital cameras, music players). Accordingly, systems and/or devices that may utilize the principles of the present invention are virtually limitless.

The previous description is of preferred embodiments for implementing the invention, and the scope of the invention should not necessarily be limited by this description. The scope of the present invention is instead defined by the following claims.

We claim:

1. A method of reading a ferroelectric memory comprising:
providing a ferroelectric memory including a ferroelectric memory cell, a charge integrator, and a bit line connecting the ferroelectric memory cell and the charge integrator;
applying a plurality of pulses to the ferroelectric memory cell, said pulses essentially not overlapping in time, each of the pulses being a value lower than that which will destroy data stored in the memory cell, each of said pulses causing said ferroelectric memory cell to output a separate output signal;
accumulating said output signals on said charge integrator; and
reading the output of the charge integrator.

2. The method according to claim 1, wherein said applying the pulses includes applying voltage pulses.

3. The method according to claim 2, wherein said applying the pulses includes applying voltage pulses of 0.5 volts or less.

4. The method according to claim 3, wherein said applying the pulses includes applying voltage pulses in the range of 0.1 to 0.5 volts.

5. The method according to claim 2, wherein said applying the pulses includes applying at least five pulses.

6. The method according to claim 1, wherein said reading is performed at a predetermined time after starting said applying the pulses.

7. The method according to claim 1, further comprising determining whether a datum value stored in the ferroelectric memory cell is a logic high or low level based on said reading the output of the charge integrator.

8. A ferroelectric memory comprising:
a ferroelectric memory cell;
a charge integrator to accumulate two or more signals received from said ferroelectric memory cell; and
a bit line connecting said memory cell and said charge integrator.

9. The ferroelectric memory according to claim 8, further comprising a read circuit for applying a plurality of pulse signals to said ferroelectric memory cell, each of the pulse signals being smaller than that which will destroy data stored in said ferroelectric memory cell.

10. The ferroelectric memory according to claim 8, wherein the pulse signal is a voltage or current pulse.

11. The ferroelectric memory according to claim 8, further comprising a switch connected to said bit line between said ferroelectric memory cell and said charge integrator.

12. The ferroelectric memory according to claim 8, wherein said charge integrator includes an operational amplifier having an input terminal and an output terminal, said bit line being connected to said input terminal.

13. The ferroelectric memory according to claim 12, wherein said charge integrator further includes a capacitor connected between said input terminal and said output terminal.

14. The ferroelectric memory according to claim 13, wherein said input terminal is a negative input terminal.

15. The ferroelectric memory according to claim 13, further comprising a switch connected between said input terminal and said output terminal and in parallel with said capacitor.

16. The ferroelectric memory according to claim 15, wherein said operational amplifier includes a second input terminal connected to a reference voltage.

17. The ferroelectric memory according to claim 16, wherein the reference voltage is a ground voltage level.

18. The ferroelectric memory as in claim 8, wherein said ferroelectric memory cell includes one transistor and one ferroelectric capacitor.

19. The ferroelectric memory according to claim 8, wherein a plurality of ferroelectric memory cells are connected to said bit line.

20. The ferroelectric memory according to claim 19, further including an array of rows and columns of said ferroelectric memory cells, one of said charge integrators being associated with each column or each row of said ferroelectric memory cells.

21. A method for reading a ferroelectric memory, comprising:
selecting a ferroelectric memory cell from which to read a datum value stored therein;
inputting a plurality of pulses to the ferroelectric memory cell, each pulse having a signal level below a coercive signal level to preserve the datum value stored therein; and
accumulating signal levels output by the ferroelectric memory cell in response to said inputting the pulses to the ferroelectric memory cell.

22. The method according to claim 21, further comprising sensing the accumulated signal level.

23. The method according to claim 22, further comprising determining the datum value based on the sensed accumulated signal level.

24. The method according to claim 22, wherein said sensing is performed at a predetermined time after starting said inputting the pulses.

25. The method according to claim 21, further comprising resetting the accumulated signal level.

26. The method according to claim 21, wherein said inputting the pulses includes inputting pulses having a voltage level less than half of the coercive signal level.

27. The method according to claim 21, further comprising:
preventing said accumulating; and
writing a new datum value into the ferroelectric memory cell.

28. A system comprising:
a ferroelectric memory including a plurality of ferroelectric memory cells configured in a matrix of rows via word lines and columns via bit lines;
a charge integrator connected to each bit line to accumulate signal levels received from a ferroelectric memory cell along a corresponding bit line; and
a read circuit selectably connected to one ferroelectric memory cell of a column to input a plurality of temporally separate pulses having a signal level below that input which destroys a stored datum value to the selected ferroelectric memory cell, the pulses causing said charge integrator to accumulate a total signal level output from the ferroelectric memory cell.

29. The system according to claim 28, further comprising a processor operable to utilize the total signal level to perform an operation.

30. The system according to claim 29, wherein the operation is a communication operation.

31. The system according to claim 29, wherein the operation is a computation operation.

* * * * *